(12) United States Patent
Nagarajan et al.

(10) Patent No.: US 9,059,716 B1
(45) Date of Patent: *Jun. 16, 2015

(54) DIGITAL PVT COMPENSATION FOR DELAY CHAIN

(71) Applicant: Altera Corporation, San Jose, CA (US)

(72) Inventors: Pradeep Nagarajan, Santa Clara, AZ (US); Yan Chong, San Jose, CA (US); Sean Shau-Tu Lu, San Jose, CA (US); Chiakang Song, Milpitas, CA (US); Joseph Huang, Morgan Hills, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/214,906

(22) Filed: Mar. 15, 2014

Related U.S. Application Data

(63) Continuation of application No. 13/486,670, filed on Jun. 1, 2012, now Pat. No. 8,680,905, which is a continuation-in-part of application No. 13/168,499, filed on Jun. 24, 2011, now Pat. No. 8,305,121, which is a continuation of application No. 12/467,681, filed on May 18, 2009, now Pat. No. 7,969,215, which is a continuation of application No. 11/789,598, filed on Apr. 24, 2007, now Pat. No. 7,535,275, which is a continuation of application No. 11/055,125, filed on Feb. 9, 2005, now Pat. No. 7,227,395.

(51) Int. Cl.
*H03L 7/00* (2006.01)

(52) U.S. Cl.
CPC ...................................... *H03L 7/00* (2013.01)

(58) Field of Classification Search
CPC ......... H03K 5/13; H03K 5/131; H03K 5/133; H03K 7/06; H03L 7/02; H03L 7/07; H03L 7/16; H03L 7/24; G01R 25/04; G01R 25/005; G06F 1/02; G06F 1/04; G06F 1/08; G06F 1/12
USPC .................. 327/154–161, 270–273, 276–277
See application file for complete search history.

(56) References Cited

U.S. PATENT DOCUMENTS

| 7,471,131 | B2 * | 12/2008 | Liu et al. ........................ 327/158 |
| 7,595,686 | B2 * | 9/2009 | Maksimovic et al. ......... 327/540 |
| 8,130,016 | B2 * | 3/2012 | Nagarajan et al. ............ 327/158 |

* cited by examiner

*Primary Examiner* — An Luu
(74) *Attorney, Agent, or Firm* — Ward & Zinna, LLC

(57) ABSTRACT

A circuit-includes a delay locked loop (DLL), a calibration circuit and an output delay chain controlled by the calibration circuit. The DLL comprises a plurality of series-coupled first delay elements, each of which has substantially the same first delay. The calibration circuit comprises a plurality of series-coupled second delay elements, each of which has substantially the same second delay that is less than the first delay, a first delay element, and a circuit for determining the minimum number of second delay elements that are needed to produce the first delay. The output delay chain comprises a plurality of series-coupled second delay elements, an input for receiving the input signal, and a circuit for selectively tapping the output delay chain at a plurality of taps in the output delay chain so as to produce in the input signal different delays of integral multiples of the second delay.

20 Claims, 3 Drawing Sheets

DIGITAL PVT COMPENSATION FOR DELAY CHAIN

CROSS-REFERENCE TO RELATED APPLICATIONS

This application is a continuation of application Ser. No. 13/486,670, filed Jun. 1, 2012, which application is a continuation-in-part of application Ser. No. 13/168,499, filed Jun. 24, 2011, which application is a continuation of application Ser. No. 12/467,681, filed May 18, 2009, now U.S. Pat. No. 7,969,215 B1, which application is a continuation of application Ser. No. 11/789,598, filed Apr. 24, 2007, now U.S. Pat. No. 7,535,275 B1, which application is a continuation of application Ser. No. 11/055,125, filed Feb. 9, 2005, now U.S. Pat. No. 7,227,395 B1, all of which applications are incorporated herein by reference.

BACKGROUND

This relates to compensation for delays in signal propagation in a circuit.

Many electronic systems require synchronization between two or more signals propagating in the system. For example, data is often transmitted to a data processing device in the system, e.g., a central processing unit (CPU) or a programmable logic device (PLD), from a memory device, through a set of communication channels. The set of communication channels typically includes one or more channels carrying data signals and one channel carrying a data strobe signal (or clock signal), whose rising/falling edges are used to sample the data signals at the memory device, the data processing device, and/or other points in the circuit. To sample the data signals accurately, it is preferred that there be a phase delay between the data signals and the clock signal so that a data sampling edge of the clock signal is positioned within a data sampling window associated with the data signals. In some systems, the clock signal preferably is at the center of the data sampling window and has a phase delay of approximately 90 degrees with respect to the data signal.

There are many factors, however, that can change the rate of propagation of a signal in a circuit. For example, process, voltage and temperature (PVT) effects, resistance/capacitance effects of circuits, delays caused by analog elements that do not track delays caused by digital circuits, and wire delays in circuit boards can all affect the rate of signal propagation. As a result, skew or phase delay may arise between two propagating signals where it is not wanted; and compensation for such delay is needed.

SUMMARY

A circuit is disclosed for compensating for time delay created in an input signal. The circuit includes a delay locked loop (DLL), a calibration circuit and an output delay chain controlled by the calibration circuit. The DLL comprises a plurality of first delay elements coupled in series in a first delay chain, each of which first delay elements has substantially the same first delay. The calibration circuit comprises a first delay element, a plurality of second delay elements coupled in series in a second delay chain, each of which second delay elements has substantially the same second delay that is less than the first delay, and a circuit for determining the minimum number of second delay elements that are needed to produce the first delay. The output delay chain comprises a plurality of second delay elements coupled in series, an input for receiving the input signal, and a circuit for selectively tapping the output delay chain at a plurality of taps in the output delay chain so as to produce in the input signal different delays of integral multiples of the second delay.

Advantageously, the second delay elements are simple delay cells formed from conventional inverters. These inverters have the desirable property that they track process, voltage and temperature (PVT) variations well.

Numerous variations may be practiced in the preferred embodiment as described in more detail below.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
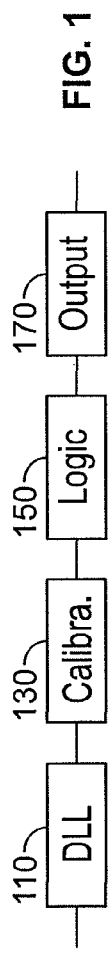
FIG. 1 is a block diagram of an illustrative embodiment of the invention.

FIG. 1 is a block diagram of an illustrative embodiment of the invention. The embodiment of FIG. 1 comprises a delay locked loop (DLL) 110, a calibration circuit 130, a logic circuit 150, and an output circuit 170. As will be described in more detail below, DLL 110 receives a clock signal at its input and generates a phase control signal at its output. The calibration circuit calibrates a first delay element of the type used in the DLL against a series of second delay elements. The calibration circuit receives the clock signal and the phase control signal at its input and determines the minimum number of second delay elements required to delay the clock signal by the amount that the first delay element delays the clock signal. This minimum number is used by logic circuit 150 to compute the number of second delay elements required to produce a desired delay in an input signal that is provided to the output circuit 170.

Figure 2:
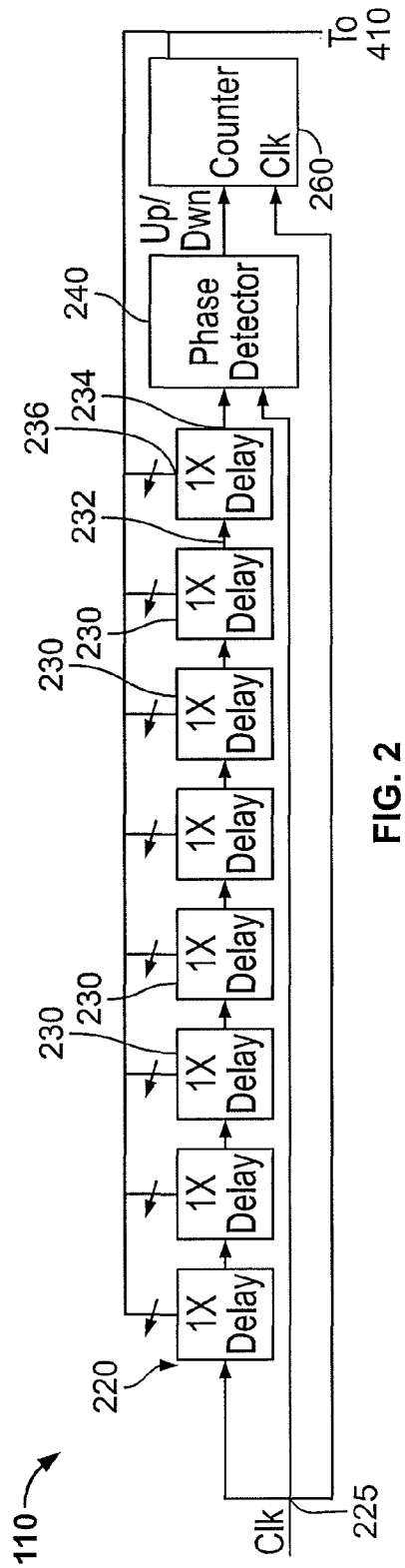
FIG. 2 is a block diagram of an illustrative embodiment of a first component of the embodiment of FIG. 1.

FIG. 2 is a block diagram of DLL 110. DLL 110 comprises a delay chain 220 comprising eight identical serially connected delay elements 230, a phase detector 240 and an up/down counter 260. Each delay element has an input 232, an output 234 and a control terminal 236. A clock signal CLK is applied to the delay chain 220 at a clock input terminal 225, which couples the clock signal to the input 232 of the first delay element in the delay chain. Each output of a delay element except the last in the chain is connected to the input of the next delay element. Each of the eight delay elements receives the same phase shift control setting at control terminal 236 and in response thereto causes the same amount of phase delay to the clock signal that passes through that delay element. The amount of phase delay per element has two components: a variable component that is determined by the phase shift control setting applied to control terminal 236 and an intrinsic component that is determined by the time it takes a signal to traverse the delay element when the variable component is zero.

The CLK signal is also coupled to a first input terminal of the phase detector 240. The output of the last delay cell in the delay chain is connected to a second input terminal of the phase detector. Thus, the phase detector 240 receives two copies of the clock signal, one with virtually no phase delay and the other with a phase delay. The phase detector 240 compares the two copies to determine whether the phase difference between the two copies is exactly 360° (or a clock cycle). If not, the phase detector 240 sends an update instruction to counter 260 which is responsible for updating the phase shift control setting Accordingly, the counter 260 increases or decreases the phase shift control setting by a certain number and the updated phase shift control setting is fed back to the phase control inputs 236 of the individual delay elements to adjust the amount of phase delay generated by each delay element until the two copies of the clock signal overlap one another. In some embodiments, it takes multiple clock cycles for the DLL to determine an optimal phase shift control setting.

For the illustrative embodiment of FIG. 2 where eight identical delay elements 230 are involved in the determination of the optimal phase shift control setting, the phase delay generated by each delay element will be approximately 360°/8=45°. The duration of the phase delay depends on the frequency F of the CLK signal and is given by $(1/F)*(1/N)$ where N is the number of delay elements 230. Thus, for a CLK signal having a frequency F of 1 GHz, the delay produced by a delay element 230 in a DLL of eight delay elements is $(10^{-9}$ sec.$)*(\frac{1}{8})=125$ picoseconds. More or fewer delay elements may be used in the practice of the invention. Using more delay elements, however, comes at the cost of using valuable real estate on the integrated circuit chip. Using fewer delay elements comes at the cost of losing resolution in the amount of delay adjustment that can be made with the DLL.

Figure 3:
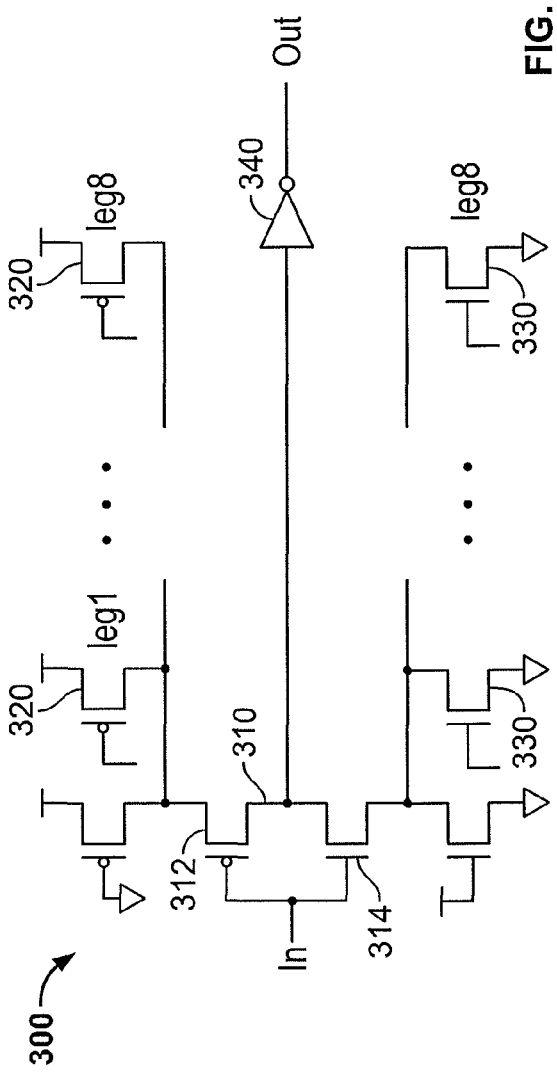
FIG. 3 is a schematic diagram of an illustrative embodiment of one element of the component of FIG. 2.

Different circuits may be used as first delay elements 230. One circuit is a current starved inverter 300 such as that shown in FIG. 3. Inverter 300 comprises a first inverter 310 comprising a first PMOS transistor 312 and a first NMOS transistor 314 connected in series, a first plurality 320 of PMOS transistors connected in parallel between a power supply and the first PMOS transistor 312, a second plurality 330 of NMOS transistors connected in parallel between the first NMOS transistor and ground, and an output inverter 340 connected to the output of first inverter 310. The input to inverter 300 is at 302; and the output is at 304. Illustratively, nine PMOS transistors are in the first plurality 320 of PMOS transistors; and nine NMOS transistors are in the second plurality 330 of NMOS transistors; but a greater number or a lesser number of transistors may be used. As is known in the art, the amount of delay produced by the current starved buffer can be varied by varying the number of PMOS transistors that are conducting in the first plurality 320 of PMOS transistors and the number of NMOS transistors that are conducting in the second plurality 330 of NMOS transistors. The number of PMOS and NMOS transistors that are conducting is specified by the phase shift control setting applied to the control terminal (not shown) of inverter 300.

Figure 4:
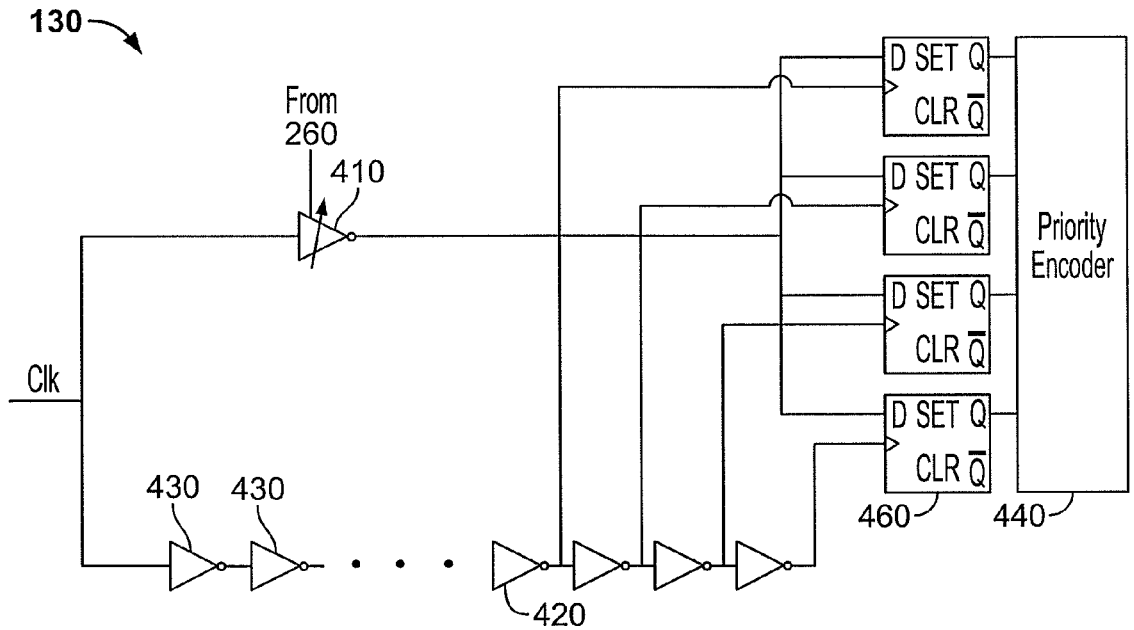
FIG. 4 is a block diagram of an illustrative embodiment of a second component of the embodiment of FIG. 1.

To achieve better resolution in the phase delay correction, calibration circuit 130 compares the phase delay produced by a first delay element with the phase delay produced by higher resolution second delay elements. As shown in FIG. 4, calibration circuit 130 comprises a first delay element 410, a delay chain 420 comprising a plurality of identical second delay elements 430 coupled in series, a priority encoder 440 having a plurality of inputs and an output, and a plurality of latches 460, each having an output coupled to one of the inputs of priority encoder 440. First delay element 410 is identical to one of delay elements 230 of FIG. 2 and receives the same phase shift control setting from up/down counter 260 that is received by each of delay elements 230. Thus, first delay element 410 delays a signal received at its input by the same amount as a delay element delays a signal received at its input 232. The inputs of the priority encoder are ranked by number starting from zero (i.e., from least significant bit to most significant bit); and the output from the priority encoder is a representation of the number starting from zero of the input that received the most significant bit. Each latch 460 has a clock input that is coupled to a tap between a different pair of second delay elements. The coupling is arranged so that the first tap is coupled to the latch whose output is coupled to the priority encoder input numbered zero; the second tap is coupled to the latch whose output is coupled to the priority encoder input labeled one; and so on. The output of the first delay element 410 is coupled in parallel to a data input at each of latches 460. Thus, the clock signal propagating through delay chain 420 samples the data input at the different latches; and the priority encoder identifies the latch at which a transition at the output of first delay element 410 is first detected, thereby determining the minimum number of second delay elements 430 required to produce the delay produced by a single first delay element.

Figure 5:
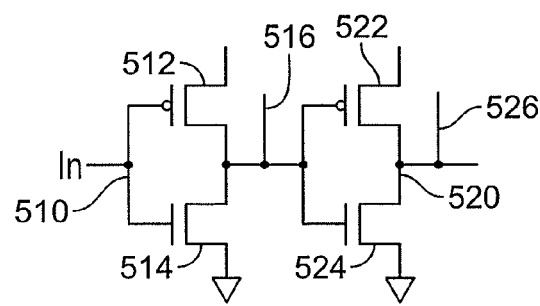
FIG. 5 is a schematic diagram of an illustrative embodiment of one element of the component of FIG. 4.

Illustratively, each second delay element 430 is a simple inverter. Two such simple inverters are illustrated in FIG. 5. As shown therein, a first inverter 510 comprises a first PMOS transistor 512 and a first NMOS transistor 514 coupled in series between a power supply and ground; and a second inverter 520 comprises a second PMOS transistor 522 and a second NMOS transistor 524 coupled in series between the power supply and ground. Each inverter has an input that is coupled to the gates of the PMOS and NMOS transistors and an output that is coupled to the input of the next inverter; and at least some of the inverters such as inverters 510, 520 also have a tap 516, 526, respectively, at their outputs. As noted above, this amount of delay will vary with process, voltage and temperature (PVT) variations at the inverter. In delay chain 420, several identical simple inverters are coupled in series with enough inverters being used to measure any delay that might be presented by the first delay element 410 over the operating range of the circuit.

Figure 6:
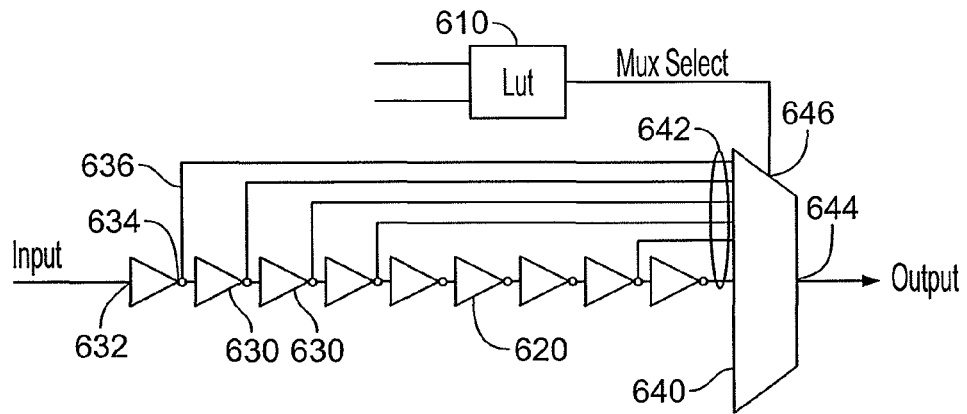
FIG. 6 is a block diagram of an illustrative embodiment of a third component of the embodiment of FIG. 1.

FIG. 6 depicts an illustrative embodiment 600 of logic circuit 150 and output circuit 170 for producing a desired phase delay in an input signal. Embodiment 600 comprises a look-up table 610, a delay chain 620, and a multiplexer 640. The delay chain comprises a plurality of second delay elements 630 coupled in series. Each second delay element 630 is a simple inverter that is identical to the second delay elements 430 depicted in FIGS. 4 and 5 and produces the same amount of delay. Each delay element has an input 632 and an output 634; and a tap 636 is located at the output of at least some of the delay elements. The input signal is applied to the input of the second delay element 630 that is first in delay chain 620. Multiplexer 640 is a many-to-one multiplexer having a plurality of inputs 642, each coupled to a different one of taps 636 at the outputs of second delay elements 630, an output 644, and a selection input 646 that receives a signal that specifies which input 642 is to be connected to output 644.

Look-up table 610 receives as inputs at least the output of the priority encoder 460 of FIG. 4 and a control signal specifying how much delay is desired to be produced in the input signal. From its inputs and information pre-stored in the table, the look-up table determines the number of second delay elements to use to produce the desired delay in the input signal. It provides to selection input 646 of multiplexer 640 the appropriate signal required to connect to the output of the multiplexer the input signal that has been delayed by the desired number of second delay elements.

Figure 7:
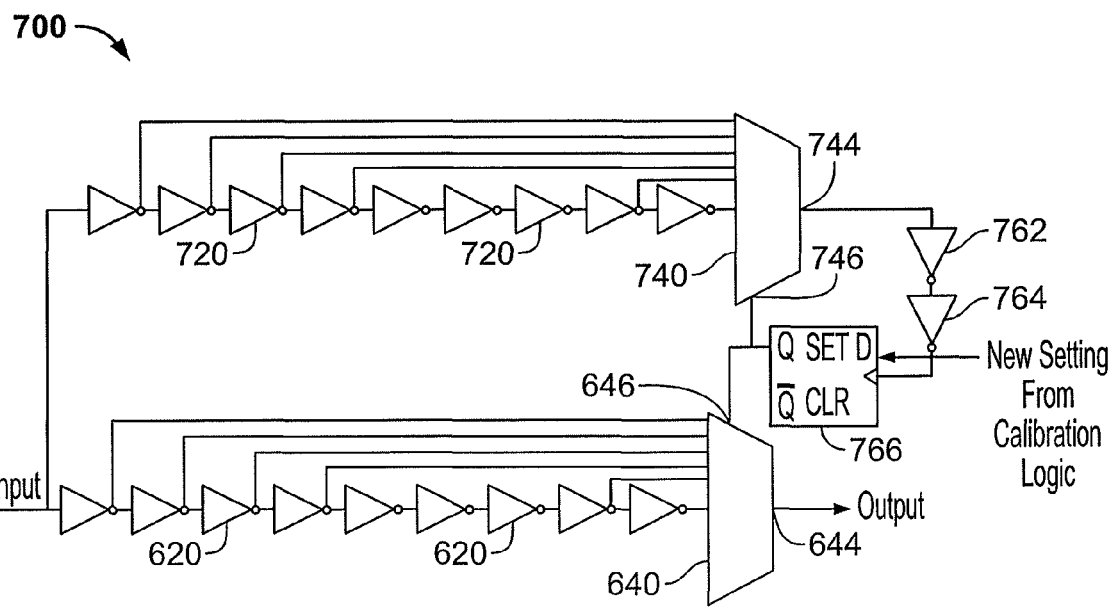
FIG. 7 is a block diagram of an alternative circuit for use in the invention.

FIG. 7 depicts an illustrative embodiment 700 of an alternative circuit that protects the integrity of the output signal from output 644 of multiplexer 640 when changes are made at the selection input 646 of multiplexer 640. The output signal of interest is a change in the amplitude of the signal, or an edge. It is desirable to avoid situations where a change in the delay chain connections might produce an output that was not distinguishable from a proper output signal. Embodiment 700 includes a first delay chain 620 and a first multiplexer 640 that are the same as delay chain 620 and multiplexer 640 of FIG. 6 and bear the same numbers. Embodiment 700 also includes a second delay chain 720 and a second multiplexer 740 that are the same as first delay chain 620 and first multiplexer 740 but function as a dummy delay chain. The clock input that is provided to the input of delay chain 620 is also provided to the input of delay chain 720. An output signal from an output 744 of multiplexer 740 is delayed by second delay elements 762, 764 and is provided as a clock input to a latch 766. Each second delay element 762, 764 is a simple inverter that is identical to second delay elements 430 and 630 and produces the same amount of delay. The data input to the latch is the number generated by logic circuit 150. The data output from the latch is provided to the selection inputs 646 and 746 of multiplexers 640, 740, respectively.

As a result of this arrangement, an input signal to delay chains 620 and 720 will produce the same output signal and therefore the same edges at outputs 644 and 744. The output signal from output 644 is available immediately for use. However, since any change in the number that is applied to selection inputs 646, 746 can only be triggered by the edge that is produced at the output 744 of multiplexer 740 and the change can only occur after the edge has been delayed by twice the delay produced by a second delay element, any change in the number applied to selection input 646 will not occur until well after the corresponding edge has been made available for use at output 644.

As will be apparent to those skilled in the art, numerous variations may be practiced within the spirit and scope of the present invention. For example, different circuits may be used for the first delay element in place of current starved inverters. Different circuits may be used for current starved inverters. Different arrangements may be used to calibrate the second delay elements against the first delay elements. And different arrangements may be used to produce the desired delay in the output circuit.

What is claimed is:

1. A circuit for controlling delay in an input signal comprising:
   a delay locked loop comprising a first plurality of first delay elements for producing a phase control signal, each first delay element having a first delay that is controllable by the phase control signal;
   a calibration circuit that determines a minimum number of second delay elements required to produce the first delay where each second delay element produces a second delay that is less than the first delay; and
   an output circuit that uses the minimum number to determine how many second delay elements to use to produce a desired delay in the input signal.

2. The circuit of claim 1 wherein the first delay elements are connected in series in a first delay chain and the delay locked loop further comprises:
   a phase detector having first and second inputs and an output; and
   an up/down counter having an input and an output
   wherein a clock signal is received at an input to the first delay chain and at the first input to the phase detector; an output from the delay chain is received at the second input to the phase detector; the output from the phase detector is coupled to the input to the up/down counter; and the output from the up/down counter is the phase control signal.

3. The circuit of claim 1 wherein the calibration circuit further comprises:
   an additional first delay element having a first delay that is controllable by the phase control signal;
   a second plurality of second delay elements coupled in series, each of which second delay elements has substantially the same second delay;
   a priority encoder having a plurality of inputs and an output; and
   a plurality of latches, each latch having a first input, a clock input and an output, the output of each latch being coupled to a different input of the priority encoder and each clock input being coupled to a tap at an output of a different second delay element; and
   the first delay element has an output that is coupled to a plurality of the first inputs of the latches, wherein a signal at the output of the priority encoder indicates the minimum number of second delay elements that are needed to produce the first delay.

4. The circuit of claim 3 wherein the output circuit further comprises:
   a third plurality of second delay elements connected in series, each second delay element having an input and an output, the input signal being coupled to the input of the first second delay element in the series; and
   a many-to-one multiplexer having a plurality of inputs each coupled to a tap at the output of a different second delay element in the third plurality of delay elements and a multiplexer selection signal that is a function of the output of the priority encoder.

5. The circuit of claim 1 wherein the output circuit further comprises:
   a second plurality of second delay elements connected in series, each second delay element having an input and an output, the input signal being coupled to the input of the first second delay element in the series; and
   a many-to-one multiplexer having a plurality of inputs each coupled to a tap at the output of a different second delay element in the second plurality of delay elements and a multiplexer selection signal that is a function of the minimum number.

6. The circuit of claim 1 wherein the first delay elements are current starved inverters.

7. The circuit of claim 1 wherein the second delay elements are simple inverters.

8. A circuit for controlling delay in an input signal comprising:
   a delay locked loop comprising a plurality of first delay elements coupled in series in a first delay chain, each of which first delay elements has substantially the same first delay;
   a calibration circuit for determining the minimum number of second delay elements that are needed to produce the first delay where each second delay element produces a second delay that is less than the first delay; and
   a second delay chain comprising a plurality of second delay elements coupled in series, an input for receiving the input signal, and a circuit for selectively tapping the second delay chain at a plurality of points in the second delay chain so as to achieve different delays of integral multiples of the second delay.

9. The circuit of claim 8 wherein the delay locked loop further comprises:
a phase detector having first and second inputs and an output; and
an up/down counter having an input and an output
wherein a clock signal is received at an input to the first delay chain and at the first input to the phase detector; an output from the first delay chain is received at the second input to the phase detector; the output from the phase detector is coupled to the input to the up/down counter; and the output from the up/down counter is a phase control signal that is used to control the first delay of each first delay element.

10. The circuit of claim 9 wherein the calibration circuit further comprises:
an additional first delay element having a first delay that is controlled by the phase control signal;
a third delay chain comprising a plurality of second delay elements coupled in series, each of which second delay elements has substantially the same second delay;
a priority encoder having a plurality of inputs and an output; and
a plurality of latches, each latch having a first input, a clock input and an output, the output of each latch being coupled to a different input of the priority encoder and each clock input being coupled to a tap at an output of a different second delay element; and
the additional first delay element has an output that is coupled to a plurality of the first inputs of the latches, wherein a signal at the output of the priority encoder indicates the minimum number of second delay elements that are needed to produce the first delay.

11. The circuit of claim 10 wherein the circuit for selectively tapping the second delay chain comprises:
a many-to-one multiplexer having a plurality of inputs each coupled to a tap at the output of a different second delay element in the second delay chain and a multiplexer selection signal that is a function of the output of the priority encoder.

12. The circuit of claim 8 wherein the calibration circuit further comprises:
an additional first delay element having a first delay;
a third delay chain comprising a plurality of second delay elements coupled in series, each of which second delay elements has substantially the same second delay;
a priority encoder having a plurality of inputs and an output; and
a plurality of latches, each latch having a first input, a clock input and an output, the output of each latch being coupled to a different input of the priority encoder and each clock input being coupled to a tap at an output of a different second delay element; and
the additional first delay element has an output that is coupled to a plurality of the first inputs of the latches, wherein a signal at the output of the priority encoder indicates the minimum number of second delay elements that are needed to produce the first delay.

13. The circuit of claim 12 wherein the circuit for selectively tapping the second delay chain comprises:
a many-to-one multiplexer having a plurality of inputs each coupled to a tap at the output of a different second delay element in the second delay chain and a multiplexer selection signal that is a function of the output of the priority encoder.

14. The circuit of claim 8 wherein the circuit for selectively tapping the second delay chain comprises:
a many-to-one multiplexer having a plurality of inputs each coupled to a tap at the output of a different second delay element in the second delay chain and a multiplexer selection signal that is a function of the output of the minimum number.

15. The circuit of claim 8 wherein the first delay elements are current starved inverters.

16. The circuit of claim 8 wherein the second delay elements are simple inverters.

17. A method for compensating for time delay in a circuit comprising:
applying a clock signal having a first frequency to a delay locked loop comprising a plurality of first delay elements, the delay locked loop producing a phase control signal that controls a first delay produced by the first delay elements;
applying the clock signal to a calibration circuit to determine a minimum number of second delay elements required to produce the first delay where each second delay element produces a second delay that is less than the first delay; and
using the minimum number to determine how many second delay elements to use to produce a desired delay in a signal having a second frequency.

18. The method of claim 17 wherein the first and second frequencies are the same.

19. The method of claim 17 further comprising the step of providing the phase control signal to an additional first delay element that is calibrated against a plurality of second delay elements connected in series in the calibration circuit.

20. The method of claim 17 wherein the first delay elements are current starved inverters and the second delay elements are simple inverters.

* * * * *